United States Patent
Yan

(10) Patent No.: US 9,106,050 B2
(45) Date of Patent: Aug. 11, 2015

(54) SELF-CHARACTERIZATION TUNABLE OPTICAL NETWORK UNIT

(71) Applicant: Futurewei Technologies, Inc., Plano, TX (US)

(72) Inventor: Xuejin Yan, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 183 days.

(21) Appl. No.: 13/650,388

(22) Filed: Oct. 12, 2012

(65) Prior Publication Data

US 2013/0094854 A1   Apr. 18, 2013

Related U.S. Application Data

(60) Provisional application No. 61/547,971, filed on Oct. 17, 2011.

(51) Int. Cl.
| | | |
|---|---|---|
| *H01S 5/062* | (2006.01) | |
| *H01S 5/0625* | (2006.01) | |
| *H04B 10/572* | (2013.01) | |
| *H01S 5/00* | (2006.01) | |
| *H01S 5/022* | (2006.01) | |
| *H01S 5/06* | (2006.01) | |
| *H01S 5/0687* | (2006.01) | |

(52) U.S. Cl.
CPC ........... *H01S 5/06256* (2013.01); *H01S 5/0014* (2013.01); *H01S 5/0064* (2013.01); *H01S 5/02284* (2013.01); *H01S 5/0617* (2013.01); *H01S 5/0687* (2013.01); *H01S 2301/02* (2013.01); *H04B 10/572* (2013.01)

(58) Field of Classification Search
CPC .. H04B 10/501; H04B 10/506; H04B 10/572; H01S 5/0014; H01S 5/0064; H01S 5/02284; H01S 5/0617; H01S 5/06256
See application file for complete search history.

(56) References Cited

U.S. PATENT DOCUMENTS

| | | | |
|---|---|---|---|
| 6,801,552 B1 * | 10/2004 | Broberg et al. | 372/29.015 |
| 7,061,943 B2 | 6/2006 | Coldren et al. | |
| 7,145,923 B2 | 12/2006 | Carter et al. | |
| 7,254,146 B2 | 8/2007 | Bodan et al. | |
| 2003/0118062 A1 | 6/2003 | Wesstrom | |

(Continued)

FOREIGN PATENT DOCUMENTS

| | | |
|---|---|---|
| CN | 1324505 A | 11/2001 |
| CN | 1839522 A | 9/2006 |

(Continued)

OTHER PUBLICATIONS

Foreign Communication From A Counterpart Application, PCT Application PCT/CN2012/083063, International Search Report and Written Opinion dated Jan. 3, 2013, 7 pages.

(Continued)

*Primary Examiner* — Leslie Pascal
(74) *Attorney, Agent, or Firm* — Conley Rose, P.C.; Grant Rodolph; Jonathan K. Polk

(57) ABSTRACT

A tunable optical transmitter, comprising a tunable laser comprising a distributed Bragg reflector (DBR) section, a phase section, and a gain section, a photodiode detector (PD) optically coupled to the tunable laser, wherein the tunable optical transmitter lacks a temperature controller, and wherein the tunable optical transmitter is configured to lock onto a wavelength at different operating temperatures.

9 Claims, 11 Drawing Sheets

(56) References Cited

U.S. PATENT DOCUMENTS

| | | | |
|---|---|---|---|
| 2004/0174915 A1 | 9/2004 | Sarlet et al. | |
| 2005/0213618 A1 | 9/2005 | Sochava et al. | |
| 2007/0268939 A1 | 11/2007 | Cattellan et al. | |
| 2008/0285603 A1* | 11/2008 | Mason et al. | 372/20 |

FOREIGN PATENT DOCUMENTS

| | | |
|---|---|---|
| CN | 1930748 A | 3/2007 |
| CN | 1995936 A | 7/2007 |
| WO | 9940654 A1 | 8/1999 |
| WO | 0022705 A1 | 4/2000 |

OTHER PUBLICATIONS

Foreign Communication From A Counterpart Application, PCT Application PCT/CN2012/083063, Written Opinion dated Jan. 3, 2013, 5 pages.

Lee, S. H., et al., "Self-Configuring Athermal Tunable DS-DBR Laser for Passive Optical Networks," 2010 Conference on Lasers and Electro-Optics (CLEO) and Quantum Electronics and Laser Science Confercne (QELS), CWN5.pdf, May 16-21, 2 pages.

Kurumida, J., et al., "Investigation of Tunable Laser Diode Control with Built-In Wavelength Monitoring and Calibration Methods," Photonics in Switching (PS), Optical Packet Switching, Memory, FlipFlops (PTuC), PTuC3.pdf, Jul. 25, 2010, 3 pages.

Sarlet, Gert, et al., "Control of Widely Tunable SSG-DBR Lasers for Dense Wavelength Division Multiplexing," Journal of Lightwave Technology, vol. 18, No. 8, Aug. 2000, pp. 1128-1138.

Woodward, S. L., "A Control Loop Which Ensures High Side-Mode-Suppression Ratio in a Tunable DBR Laser," IEEE Photonics Technology Letters, vol. 4, No. 5, May 1992, pp. 417-419.

"Part 3: Carrier Sense Multiple Access with Collision Detection (CSMA/CD) Access Method and Physical Layer Specifications," IEEE Standard for Information Technology—Telecommunications and Information Exchange between systems—Local and Metropolitan Area Networks—Specific Requirements, IEEE Std 802.3™-2008, Dec. 26, 2008, 671 pages.

"Part 3: Carrier Sense Multiple Access with Collision Detection (CSMA/CD) Access Method and Physical Layer Specifications," IEEE Standard for Information Technology—Telecommunications and Information Exchange Between Systems—Local and Metropolitan Area Networks—Specific Requirements, Section 2, IEEE Std 802.3™-2008, Dec. 26, 2008, 790 pages.

"Part 3: Carrier Sense Multiple Access with Collision Detection (CSMA/CD) Access Method and Physical Layer Specifications," IEEE Standard for Information Technology—Telecommunications and Information Exchange Between Systems—Local and Metropolitan Area Networks—Specific Requirements, Section 3, IEEE Std 802.3™-2008, Dec. 26, 2008, 315 pages.

"Part 3: Carrier Sense Multiple Access with Collision Detection (CSMA/CD) Access Method and Physical Layer Specifications," IEEE Standard for Information Technology—Telecommunications and Information Exchange Between Systems—Local and Metropolitan Area Networks—Specific Requirements, Section 4, IEEE Std 802.3™-2008, Dec. 26, 2008, 586 pages.

"Part 3: Carrier Sense Multiple Access with Collision Detection (CSMA/CD) Access Method and Physical Layer Specifications," IEEE Standard for Information Technology—Telecommunications and Information Exchange Between Systems—Local and Metropolitan Area Networks—Specific Requirements, Section 5, IEEE Std 802.3™-2008, Dec. 26, 2008, 615 pages.

"Part 3: Carrier Sense Multiple Access with Collision Detection (CSMA/CD) Access Method and Physical Layer Specifications—Amendment 1: Physical Layer Specifications and Parameters for 10 Gb/s Passive Optical Networks," IEEE Standard for Information Technology—Telecommunications and Information Exchange Between Systems—Local and Metropolitan Area Networks—Specific Requirements, IEEE Std 802.3av™-2009, Oct. 30, 2009, 236 pages.

"Series G: Transmission Systems and Media, Digital Systems and Networks, Digital Sections and Line System—Optical Line Systems for Local and Access Networks—ONT Management and Control Interface Specification for B-PON," ITU-T G.983.2, Jul. 2005, 370 pages.

"Series G: Transmission Systems and Media, Digital Systems and Networks, Digital Sections and Line System—Optical Line Systems for Local and Access Networks—ONT Management and Control Interface Specification for B-PON-Amendment 1: Omnibus Improvements for OMCI," ITU-T G.983.2, Mar. 2006, 198 pages.

"Series G: Transmission Systems and Media, Digital Systems and Networks, Digital Sections and Line System—Optical Line Systems for Local and Access Networks—ONT Management and Control Interface Specification for B-PON-Erratum 1," ITU-T G.983.2, Jun. 1, 2006, 1 page.

"Series G: Transmission Systems and Media, Digital Systems and Networks, Digital Sections and Line System—Optical Line Systems for Local and Access Networks—ONT Management and Control Interface Specification for B-PON-Erratum 1," ITU-T G.984.1, Jan. 2007, 64 pages.

"Series G: Transmission Systems and Media, Digital Systems and Networks, Digital Sections and Line System—Optical Line Systems for Local and Access Networks—Gigabit-Capable Passive Optical Networks (GPON): General Characteristics," ITU-T G.984.1, Mar. 2008, 43 pages.

"Series G: Transmission Systems and Media, Digital Systems and Networks, Digital Sections and Line System—Optical Line Systems for Local and Access Networks—Gigabit-Capable Passive Optical Networks (GPON): General Characteristics—Amendment 1," ITU-T G.984.1, Oct. 2009, 8 pages.

"Series G: Transmission Systems and Media, Digital Systems and Networks, Digital Sections and Line System—Optical Line Systems for Local and Access Networks—Gigabit-Capable Passive Optical Networks (GPON): Physical Media Dependent (PMD) Layer Specification," ITU-T G.984.2, Mar. 2003, 38 pages.

"Series G: Transmission Systems and Media, Digital Systems and Networks, Digital Sections and Line System—Optical Line Systems for Local and Access Networks—Gigabit-Capable Passive Optical Networks (GPON): Physical Media Department (PMD) Layer Specification—Amendment 1: New Appendix III—Industry Best Practice for 2.488 Gbit/s Downstream, 1.244 G/bits Upstream G-PON," ITU-T G.984.2, Feb. 2006, 12 pages.

"Series G: Transmission Systems and Media, Digital Systems and Networks, Digital Sections and Line System—Optical Line Systems for Local and Access Networks—Gigabit-Capable Passive Optical Networks (GPON): Physical Media Dependent (PMD) Layer Specification—Amendment 2," ITU-T G.984.2, Mar. 2008, 16 pages.

"Series G: Transmission Systems and Media, Digital Systems and Networks, Digital Sections and Line System—Optical Line Systems for Local and Access Networks—Gigabit-Capable Passive Optical Networks (GPON): Transmission Convergence Layer Specification," ITU-T G.984.3, Mar. 2008, 146 pages.

"Series G: Transmission Systems and Media, Digital Systems and Networks, Digital Sections and Line System—Optical Line Systems for Local and Access Networks—Gigabit-Capable Passive Optical Networks (GPON): Transmission Convergence Layer Specification—Amendment 1: Specification of the ONU Registration Method and Various Clarifications," ITU-T G.984.3, Feb. 2009, 16 pages.

"Series G: Transmission Systems and Media, Digital Systems and Networks, Digital Sections and Line System—Optical Line Systems for Local and Access Networks—Gigabit-Capable Passive Optical Networks (GPON): Transmission Convergence Layer Specification—Amendment 2: Time-of-Day Distribution and Maintenance Updates and Clarifications," ITU-T G.984.3, Nov. 2009, 18 pages.

"Series G: Transmission Systems and Media, Digital Systems and Networks, Digital Sections and Line System—Optical Line Systems for Local and Access Networks—Gigabit-Capable Passive Optical Networks (GPON): ONT Management and Control Interface Specification," ITU-T G.984.4, Feb. 2008, 430 pages.

"Series G: Transmission Systems and Media, Digital Systems and Networks, Digital Sections and Line System—Optical Line Systems for Local and Access Networks—Gigabit-Capable Passive Optical

(56) References Cited

OTHER PUBLICATIONS

Networks (GPON): ONT Management and Control Interface Specification—Amendment 1," ITU-T G.984.4, Jun. 2009, 92 pages.
"Series G: Transmission Systems and Media, Digital Systems and Networks, Digital Sections and Line System—Optical Line Systems for Local and Access Networks—Gigabit-Capable Passive Optical Networks (GPON): ONT Management and Control Interface Specification—Erratum 1," ITUT G.984.4, Aug. 12, 2009, 2 pages.
"Series G: Transmission Systems and Media, Digital Systems and Networks, Digital Sections and Line System—Optical Line Systems for Local and Access Networks—Gigabit-Capable Passive Optical Networks (GPON): ONT Management and Control Interface Specification—Amendment 2: Changes and Extensions to the OMCI, Editorial Clarifications and Corrections," ITU-T G.984.4, Nov. 2009, 164 pages.
"Series G: Transmission Systems and Media, Digital Systems and Networks, Digital Sections and Line System—Optical Line Systems for Local and Access Networks—Gigabit-Capable Passive Optical Networks (GPON): ONT Management and Control Interface Specification—Corrigendum 1," ITU-T G.984.4, Mar. 2010, 8 pages.
"Series G: Transmission Systems and Media, Digital Systems and Networks, Digital Sections and Line System—Optical Line Systems for Local and Access Networks—Gigabit-Capable Passive Optical Networks (GPON): ONT Management and Control Interface Specification—Amendment 3: Clarification of Scope of Application," ITU-T G.984.4, Jul. 2010, 10 pages.
"Series G: Transmission Systems and Media, Digital Systems and Networks, Digital Sections and Line System—Optical Line Systems for Local and Access Networks—Gigabit-Capable Passive Optical Networks (G-PON): Enhancement Band," ITU-T G.984.5, Sep. 2007, 22 pages.
"Series G: Transmission Systems and Media, Digital Systems and Networks, Digital Sections and Line System—Optical Line Systems for Local and Access Networks—Gigabit-Capable Passive Optical Networks (G-PON): Enhancement Band—Amendment 1," ITU-T G.984.4, Oct. 2009, 12 pages.
"Series G: Transmission Systems and Media, Digital Systems and Networks, Digital Sections and Line System—Optical Line Systems for Local and Access Networks—Gigabit-Capable Passive Optical Networks (GPON): Reach Extension," ITU-T G.984.6, Mar. 2008, 40 pages.
"Series G: Transmission Systems and Media, Digital Systems and Networks, Digital Sections and Line System—Optical Line Systems for Local and Access Networks—Gigabit-Capable Passive Optical Networks (G-PON): Reach Extension—Amendment 1: Wavelength-Converting, Continuous Mode, and 1:N-Protected Range Extenders," ITU-T G.984.6, Nov. 2009, 28 pages.
"Series G: Transmission Systems and Media, Digital Systems and Networks, Digital Sections and Line System—Optical Line Systems for Local and Access Networks—Gigabit-Capable Passive Optical Networks (G-PON): Long Reach," ITU-T G.984.7, Jul. 2010, 14 pages.
Foreign Communication From A Counterpart Application, European Application No. 12841326.7, Extended European Search Report dated Jan. 9, 2015, 10 pages.

* cited by examiner

| Channel | Wavelength(nm) | DBR Bias(mA) | Phase Bias (mA) | Filter Bias (mA) | SMSR (dB) |
|---|---|---|---|---|---|
| 1 | 1535.812 (ITU grid:1535.82) | 3.86 | 0.53 | 25.12 | 44.6 |
| 2 | 1536.62 (1536.61) | 2.70 | 1.42 | 32.98 | 33.1 |
| 3 | 1537.368 (1537.40) | 2.20 | 0.38 | 39.48 | 44.2 |
| 4 | 1538.208 (1538.19) | 1.43 | 0.29 | 45.00 | 44.6 | ium
SELF-CHARACTERIZATION TUNABLE OPTICAL NETWORK UNIT

CROSS-REFERENCE TO RELATED APPLICATIONS

The present application claims the benefit of U.S. Provisional Patent Application No. 61/547,971 filed Oct. 17, 2011 by Xuejin Yan, et al. and entitled "Self-Characterization Tunable Optical Network Unit," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A passive optical network (PON) is a point-to-multipoint, fiber to the premises network architecture in which unpowered optical splitters are used to enable a single optical transmitter to serve multiple premises. A PON may consist of an optical line terminal (OLT) at the service provider's central office and a number of optical network units (ONUs) near end users. A PON reduces the amount of fiber and central office equipment required compared with point-to-point architectures. A number of ONUs may share the same wavelength over the optical fiber.

SUMMARY

In one embodiment, the disclosure includes a tunable optical transmitter, comprising a tunable laser comprising a distributed Bragg reflector (DBR) section, a phase section, and a gain section, a photodiode detector (PD) optically coupled to the tunable laser, wherein the tunable optical transmitter lacks a temperature controller, and wherein the tunable optical transmitter is configured to lock onto a wavelength at different operating temperatures.

In another embodiment, the disclosure includes a tunable optical transmitter, comprising a tunable laser comprising a distributed Bragg reflector (DBR) section, a phase section, and a gain section, a DBR section current generator coupled to the DBR section, a phase section current generator coupled to the phase section, wherein the phase section current generator is optically combined with the DBR section current generator, a gain bias generator coupled to the gain section and configured to bias the gain at a current exceeding a threshold current for the gain section, a power monitor coupled to the tunable laser and configured to measure an output laser power for a plurality of scanning current values, and a processor coupled to the power monitor and configured to determine a first current value for a power maximum point and a second current value for a power minimum point of the output laser power, and determine a DBR bias current value, a phase section bias current value, and a gain bias current value for a substantially maximal power output for a wavelength.

In another embodiment, the disclosure includes a method for automatic self-characterization of a tunable optical network unit (ONU), comprising applying a first bias to a gain section of a tunable laser, wherein the first bias exceeds a threshold current for the gain section, applying a second bias to one of a phase section and a DBR section of the tunable laser, applying a scanning current to one of the DBR section and the phase section, measuring a laser output power curve for the scanning current, determining a power maximum current value and a power minimum current value from the laser output power curve for the tunable laser, and transmitting a data signal based on the determined power maximum current value and the power minimum current value.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
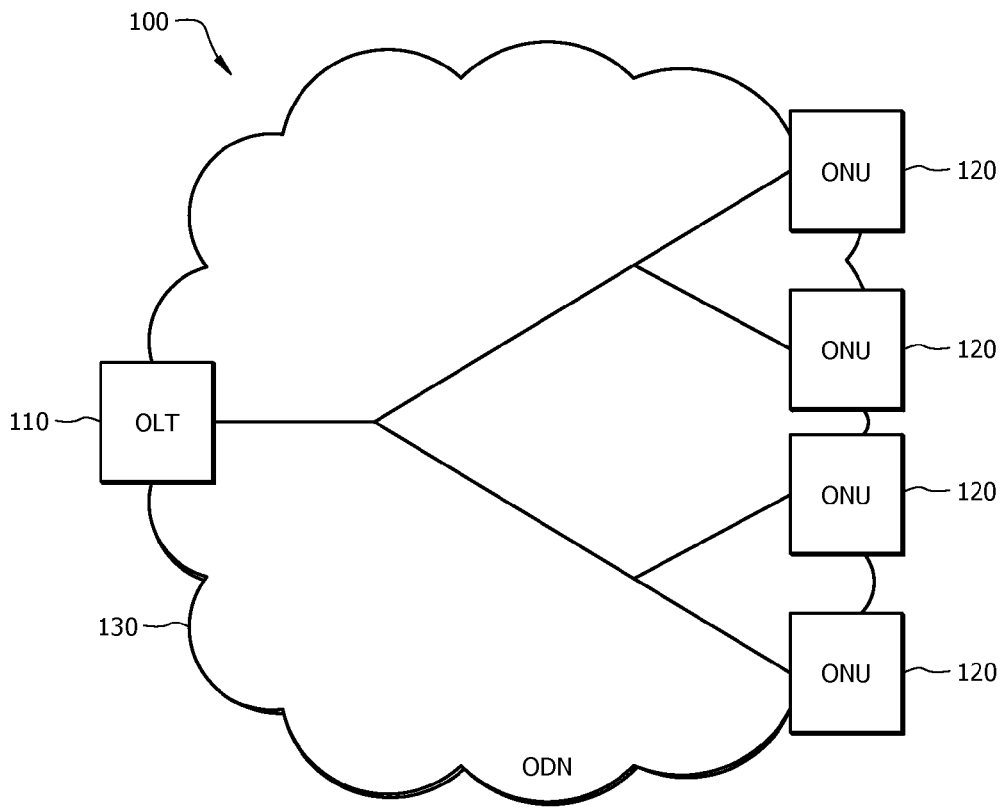
FIG. 1 is a schematic diagram of one embodiment of a PON.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are systems, methods, and apparatuses for a self-characterization tunable ONU. In an embodiment, the tunable transmit optical sub-assembly (TOSA) of a tunable ONU is characterized by means of tunable laser output power characterization (undulation—e.g., power fluctuations) with the wavelength tuning (e.g., by tuning the distributed Bragg reflector (DBR) and the phase bias current). As an initial or recurrent configuration, a scanning voltage or current may be applied to the DBR section of the tunable laser, and the photodiode detector (PD) power monitor of the tunable laser may record the tunable laser's output power value. The data of laser output power and the power's correspondence scanning current value may be saved to the ONU memory. The Microcontroller or field-programmable gate array (FPGA) of the ONU may analyze the data and find the DBR section and/or laser phase section current values for which the laser output power has maximum and minimum values. These values may be related to laser mode hopping and optimal working points depending on whether the PD power monitor is on the gain side or on the DBR side. The method of obtaining the optimal working points on the laser phase section may be similar to the DBR section scanning approach. In an embodiment, scanning voltage or current on the laser phase section may also be performed. These current values of the phase bias points may also be saved to the ONU memory and used for ONU wavelength set-up in the system.

During ONU operation, the saved values may be used to re-characterize the tunable ONU transmitter's wavelength, which may have wandered due to environmental (e.g., temperature) changes. The DBR mode hopping bias current data, the phase mode hopping bias current data, and the DBR optimal bias point values may be used for new DBR scanning current values for the tunable transmitter wavelength setting. Furthermore, these values may be used to re-characterize the tunable ONU transmitter to ensure substantially maximum power output for a particular channel or wavelength (which increases transmission distance) since the wavelength may be quasi-stable for a given range of bias currents, but the output power may vary greatly for the same wavelength. The tunable ONU transmitter may re-characterize itself once a day to several times a day without interrupting data transmission. In an embodiment, the disclosed tunable self-characterization transmitter may be used as a second phase Next Generation PON (NGPON2) (40 gigabit PON (GPON) or 80 GPON) ONU transmitter. The disclosed self-characterizing tunable transmitter may save tunable TOSA characterization cost and may make a PON system more flexible and manageable. Although described with respect to an ONU, the systems and methods described herein may also be used in an OLT or other optical transmitter.

FIG. 1 illustrates one embodiment of a PON 100. The PON 100 comprises an OLT 110, a plurality of ONUs 120, and an optical distribution network (ODN) 130, which may be coupled to the OLT 110 and the ONUs 120. The PON 100 may be a communications network that does not require any active components to distribute data between the OLT 110 and the ONUs 120. Instead, the PON 100 may use the passive optical components in the ODN 130 to distribute data between the OLT 110 and the ONUs 120. In an embodiment, the PON 100 may be a Next Generation Access (NGA) system, such as a ten gigabit per second (Gbps) GPON (XG-PON), which may have a downstream bandwidth of about ten Gbps and an upstream bandwidth of at least about 2.5 Gbps. Alternatively, the PON 100 may be any Ethernet based network, such as an Ethernet PON (EPON) defined by the Institute of Electrical and Electronics Engineers (IEEE) 802.3ah standard, a 10 Gigabit EPON as defined by the IEEE 802.3av standard, an asynchronous transfer mode PON (APON), a broadband PON (BPON) defined by the International Telecommunication Union Telecommunication Standardization Sector (ITU-T) G.983 standard, a GPON defined by the ITU-T G.984 standard, or a wavelength division multiplexed (WDM) PON (WPON), all of which are incorporated herein by reference as if reproduced in their entirety.

In an embodiment, the OLT 110 may be any device that is configured to communicate with the ONUs 120 and another network (not shown). Specifically, the OLT 110 may act as an intermediary between the other network and the ONUs 120. For instance, the OLT 110 may forward data received from the network to the ONUs 120, and forward data received from the ONUs 120 onto the other network. Although the specific configuration of the OLT 110 may vary depending on the type of PON 100, in an embodiment, the OLT 110 may comprise a transmitter and a receiver. When the other network is using a network protocol, such as Ethernet or Synchronous Optical Networking/Synchronous Digital Hierarchy (SONET/SDH), that is different from the PON protocol used in the PON 100, the OLT 110 may comprise a converter that converts the network protocol into the PON protocol. The OLT 110 converter may also convert the PON protocol into the network protocol. The OLT 110 may be typically located at a central location, such as a central office, but may be located at other locations as well.

In an embodiment, the ONUs 120 may be any devices that are configured to communicate with the OLT 110 and a customer or user (not shown). Specifically, the ONUs 120 may act as an intermediary between the OLT 110 and the customer. For instance, the ONUs 120 may forward data received from the OLT 110 to the customer, and forward data received from the customer onto the OLT 110. Although the specific configuration of the ONUs 120 may vary depending on the type of PON 100, in an embodiment, the ONUs 120 may comprise an optical transmitter configured to send optical signals to the OLT 110 and an optical receiver configured to receive optical signals from the OLT 110. Additionally, the ONUs 120 may comprise a converter that converts the optical signal into electrical signals for the customer, such as signals in the Ethernet or asynchronous transfer mode (ATM) protocol, and a second transmitter and/or receiver that may send and/or receive the electrical signals to a customer device. In some embodiments, ONUs 120 and optical network terminals (ONTs) are similar, and thus the terms are used interchangeably herein. The ONUs 120 may be typically located at distributed locations, such as the customer premises, but may be located at other locations as well.

In an embodiment, the ODN 130 may be a data distribution system, which may comprise optical fiber cables, couplers, splitters, distributors, and/or other equipment. In an embodiment, the optical fiber cables, couplers, splitters, distributors, and/or other equipment may be passive optical components. Specifically, the optical fiber cables, couplers, splitters, distributors, and/or other equipment may be components that do not require any power to distribute data signals between the OLT 110 and the ONUs 120. Alternatively, the ODN 130 may comprise one or a plurality of active components, such as optical amplifiers. The ODN 130 may typically extend from the OLT 110 to the ONUs 120 in a branching configuration as shown in FIG. 1, but may be alternatively configured in any other point-to-multi-point configuration.

The PON 100 may have a maximum transmission distance less than or equal to about 20 kilometers (km) and a splitting ratio less than or equal to about 1:64. For instance, a plurality of splitters may be used in the ODN 130 to split each branch of fiber into a plurality of branches until reaching such splitting ratio. Typically, to increase the splitting ratio and increase the maximum transmission distance of the PON 100, a plurality of optical amplifiers and/or regenerators may be added, for instance to couple some of the fiber cables in the ODN 130 and thus boost the optical signal power for longer reach and/or larger splitting ratio. However, such combination of splitters and optical amplifiers (or regenerators) may increase the cost of deployment, which may not be desirable or practical.

In an embodiment, a 40 Gigabit per second (Gb/s) PON system with four wavelengths (10 Gb/s per wavelength) are used for downstream data transmission (e.g., from the OLT to the ONUs), and four wavelengths (2.5 Gb/s or 10 Gb/s (with electroabsorption (EA) modulator) per wavelength) are used for upstream data transmission (e.g., from the ONUs to the OLT). In order to decrease ONU wavelength inventory, a three-section tunable laser disclosed herein may be used at the ONU transmitter. The disclosed three-section tunable laser self-characterization approach may lower tunable ONU cost and/or complexity and 40 Gb/s (40 G) PON system cost and/or complexity.

Figure 2:
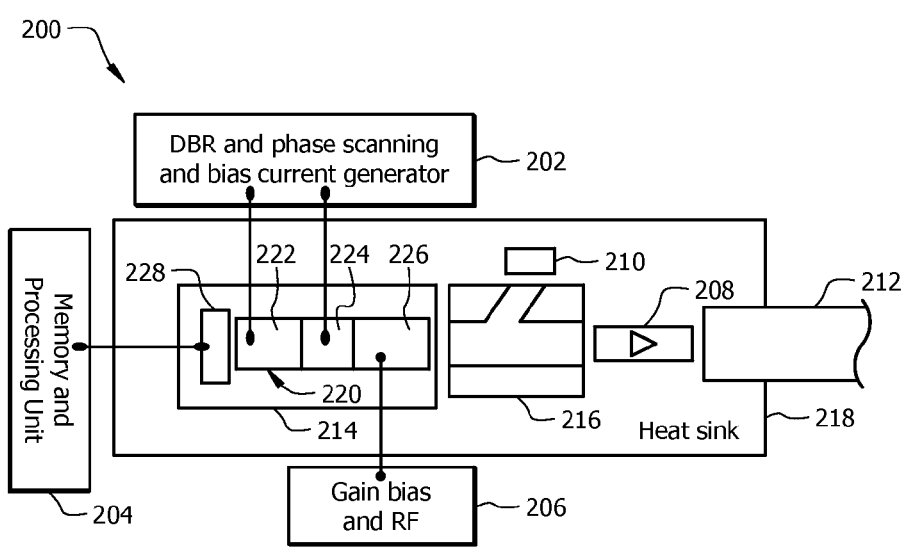
FIG. 2 is a schematic diagram of a self-characterization tunable ONU Transmitter (Tx) in accordance with a disclosed embodiment.

FIG. 2 is a schematic diagram of a self-characterization tunable ONU transmitter (Tx) 200 in accordance with a disclosed embodiment. The ONU Tx 200 may comprise a memory and processing unit 204, a DBR and phase scanning and bias current generator 202, a gain bias and radio frequency (RF) generator 206, a submount 214 comprising a PD 228 and a tunable laser 220, a splitter 216, a PD power monitor 210, an isolator 208, a heat sink 218, an optical waveguide (or optical fiber) 212, and an optional thermoelectric cooler (TEC) temperature controller (not shown). The tunable laser 220 may comprise a DBR section 222, a phase section 224, and a gain section 226. The submount 214, splitter 216, PD power monitor 210, isolator 208, and optical fiber 212 may be mounted on heat sink 218. In an embodiment that includes a TEC temperature controller, the TEC temperature controller may control the temperature of the tunable laser 220 within a specified frequency range.

The memory and processing unit 204 may comprise a memory and a processor. The processor in memory and processor unit 204 may be a single-core or multi-core microcontroller, a CPU, or a FPGA. The memory and processor unit 204 may be used to measure, correlate, and store the various values (e.g., current versus wavelength) discussed herein. The PD 228 may be used for detecting optical signals and/or automatic characterization of the tunable laser 220. The DBR and phase scanning and bias current generator 202 may be coupled to DBR section 222 and phase section 224 and may provide a bias voltage/current to the DBR section 222 and the phase section 224 during both the configuration (e.g., DBR/phase scanning) and data transmission. The gain bias and RF generator 206 may be coupled to gain section 226 and used to bias the gain section 226 of the tunable laser 220 during both configuration (e.g., DBR/phase scanning) and data transmission. Heat sink 218 may remove heat from the submount 214, the splitter 216, the PD power monitor 210, the isolator 208, and/or the optical fiber 212.

The PD power monitor 210 may determine the output laser optical power from one face of the splitter 216. Depending on the splitting ratio, the optical power detected by the PD power monitor 210 may be between about 2% and about 10% of the total output optical laser power. Isolator 208 allows the transmission of optical signals in only one direction (e.g., from the laser 220 to optical fiber 212). Isolator 208 prevents unwanted feedback into the laser 220. Optical fiber 212 provides a medium to transmit the optical signal(s) from the laser 220 to an ODN.

The laser 220 may be excited or lase via current/voltage applied to the gain section 226. In an embodiment, two current sources may be used for current generator 202. One current source may be for the DBR, and the other current source may be for the phase. The two current sources may be different and may provide a constant current bias and a scanning current profile for the DBR section 222 and the phase section 224 of the laser 220, respectively. At the back side of the laser 220, a PD 228 may be used to determine the laser wavelength and/or characterize the tunable laser 220 wavelength tuning specifications, such as how many mode hopping the laser 220 has for a specific DBR current tuning range and the current value at mode hopping points. Similar results may be obtained from phase section 224 current scanning. The laser power from the laser's gain 226 facet output (e.g., the front side of the laser 220) may be coupled into an input on the optical splitter 216. The optical splitter 216 may have two output facets. One output facet may be coupled to the optical fiber 212 via isolator 208, and the other output facet may be coupled to the PD power monitor 210. The splitter splitting ratio of optical power to optical fiber 212 and to optical power PD 210 may be in the range of about 98:2 to about 90:10. Thus, most of the power may be directed into the optical fiber 212 (e.g., between about 90% and about 98% of the power) and about 2% to about 10% of optical power is provided to the PD power monitor 210.

Figure 3:
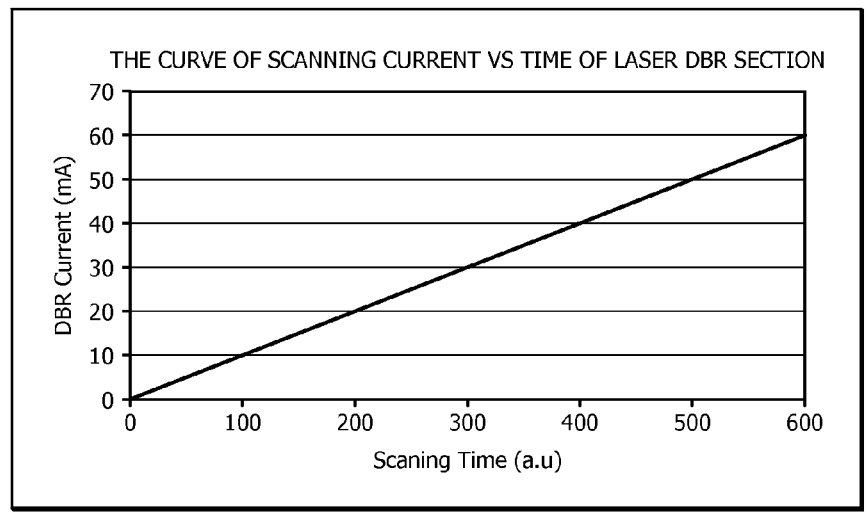
FIG. 3 is graph of a DBR scanning current profile for the self-characterization tunable ONU Tx shown in FIG. 2 in accordance with a disclosed embodiment.

FIG. 3 is a DBR scanning current profile 300 for the self-characterization tunable ONU 300 shown in FIG. 2. The current profile 300 shows the DBR current in milliamps (mA) as a function of scanning time. As shown, the DBR current has a linear relationship with time with the current increasing linearly from zero with increasing time. In an embodiment, the DBR scanning current may be a constant range steps or various range steps and the step range may be between about 0.01 mA to about 0.1 mA or other steps.

Figure 4:
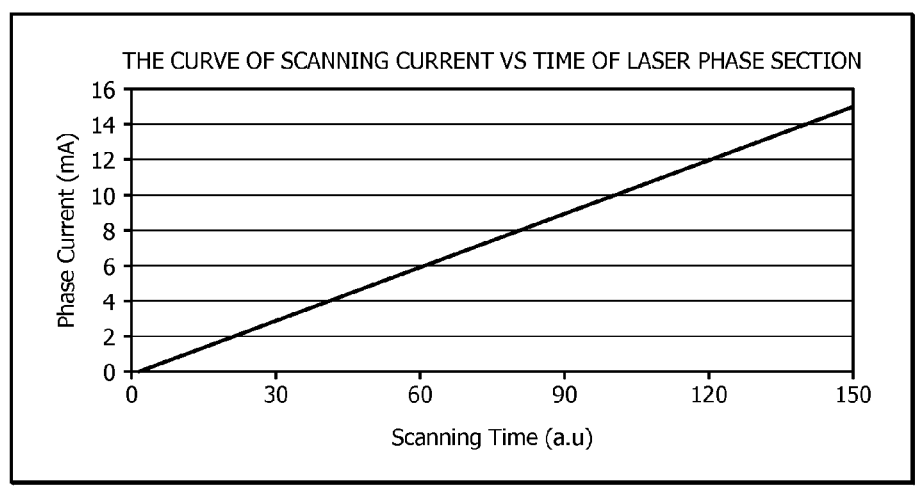
FIG. 4 is a graph of the phase section scanning current profile for the self-characterization tunable ONU Tx shown in FIG. 2 in accordance with a disclosed embodiment.

FIG. 4 is a graph of the phase section scanning current profile 400 for the self-characterization tunable ONU Tx 200 shown in FIG. 2. The phase section scanning current profile 400 is similar to the DBR current profile 300. The phase section scanning current profile 400 shows the phase current in mA as a function of scanning time. The phase current increases linearly from about zero mA with increasing time as shown. In an embodiment, the phase scanning current step is uniform and the current step size may be from about 0.005 mA to about 0.01 mA. Other values for the current step size may be used in other embodiments.

Figure 5:
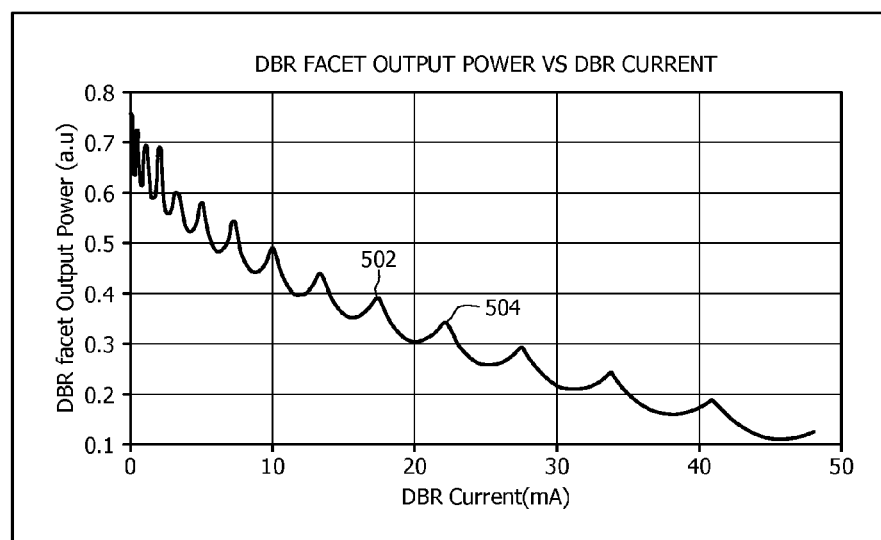
FIG. 5 is a graph of the DBR facet output power versus DBR current for the self-characterization tunable ONU Tx shown in FIG. 2 in accordance with a disclosed embodiment.

Returning to FIG. 2, when the tunable laser 220 gain section 226 is biased at its threshold current above, for example, two times threshold current, the laser 220 lases. When (1) a scanning current is applied on the DBR section 222 and (2) the gain section 226 and the phase section 224 bias currents are kept constant, the laser 220 output power undulates. FIG. 5 shows output power undulation curve with DBR section 222 current change, which is measured from the DBR section 222 facet and DBR spontaneous emitting light power is ignored. Alternatively, an edge filter (not shown) may be used to remove DBR spontaneous emitting light. The phase section 224 may be biased at a certain current value which may be in the phase scanning current range or the phase bias current may be zero.

FIG. 5 is a graph 500 of DBR facet output power versus DBR current for the self-characterization tunable ONU Tx 200 shown in FIG. 2. Graph 500 shows the relationship of the tunable laser output power from the DBR facet with the DBR bias current. The graph 500 shows that the DBR facet output power generally decreases with increasing DBR current with localized maximums and minimums in the DBR facet output power occurring at various points as the DBR current is increased. The maximum points are the laser mode hopping positions. These data points may be saved in the memory of memory and processing unit 204. The memory and processing unit 204 may find the current values that correspond to these maximum power points and save them to the memory of memory and processing unit 204. The average of two adjacent maximum point current values may be the substantially optimal DBR bias current value at that mode. For the results shown in FIG. 5, the laser was biased at two times the threshold current, and the phase bias current was zero.

Figure 6:
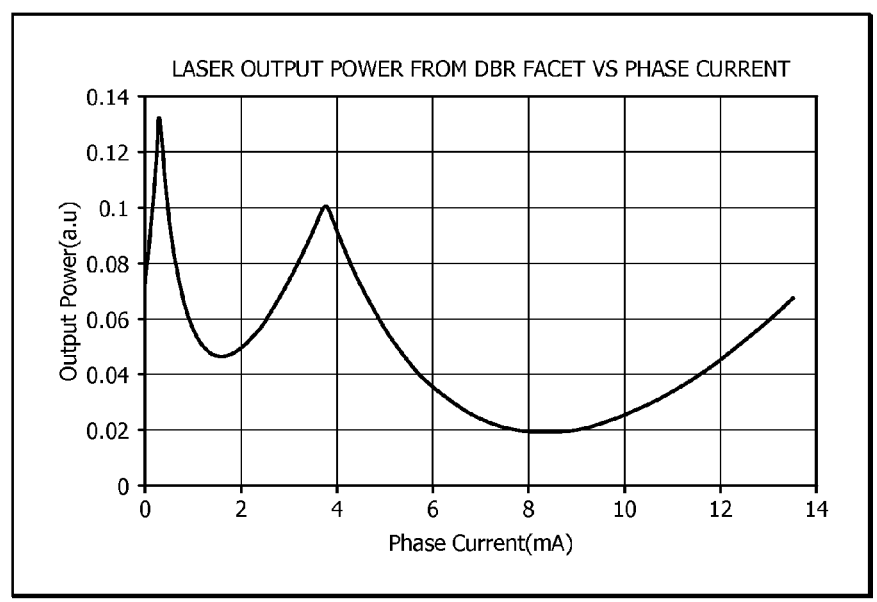
FIG. 6 is a graph of laser output power from DBR facet and phase bias current for the self-characterization tunable ONU Tx shown in FIG. 2.

FIG. 6 shows the curve 600 of laser output power from the DBR section 222 facet and the phase section 224 bias current for the self-characterization tunable ONU Tx 200 shown in FIG. 2. For the phase section 224, the results of current scanning and output power are similar to the DBR section 222 current scanning's results. When the gain section 226 of the laser 220 is biased at its threshold above (e.g., two times the threshold current), the laser 220 output power also appears to undulate when the gain section 226 and the DBR section 222 bias currents are kept constant. The DBR optimal bias current values may be found in FIG. 5 by averaging two adjacent power peak 502, 504 current values. For the results shown in FIG. 6, the laser 220 gain section 226 was biased at two times the threshold current, and the DBR section 222 was biased at about 11.8 mA.

Figure 7:
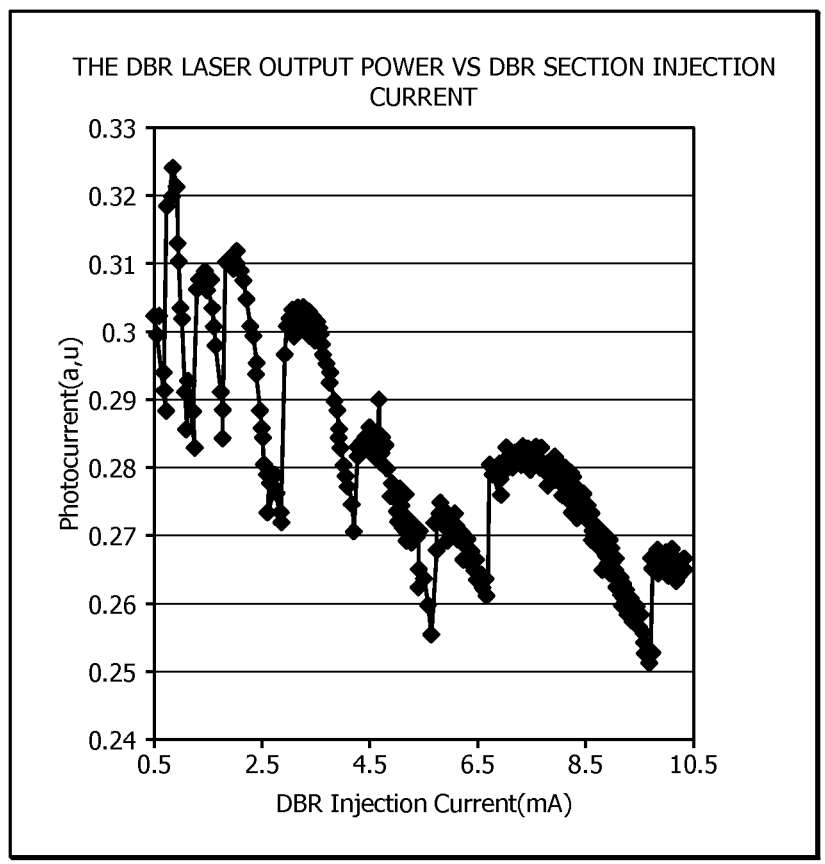
FIG. 7 is a graph that shows the curve of DBR section laser output power versus DBR section injection current for the self-characterization tunable ONU Tx shown in FIG. 2.
Figure 8:
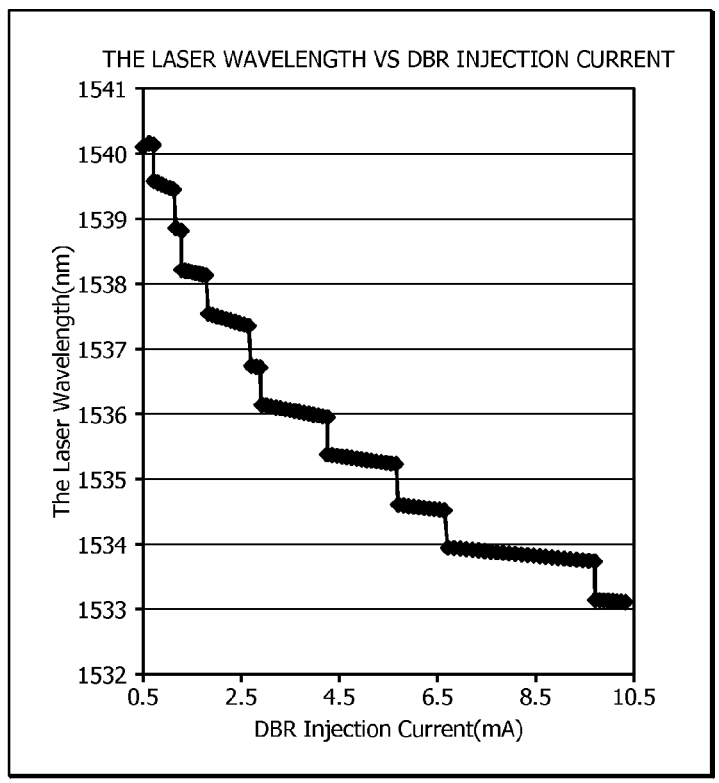
FIG. 8 is a graph that shows the curve of the laser wavelength as a function of the DBR section injection current for the self-characterization tunable ONU Tx shown in FIG. 2.
Figure 9:
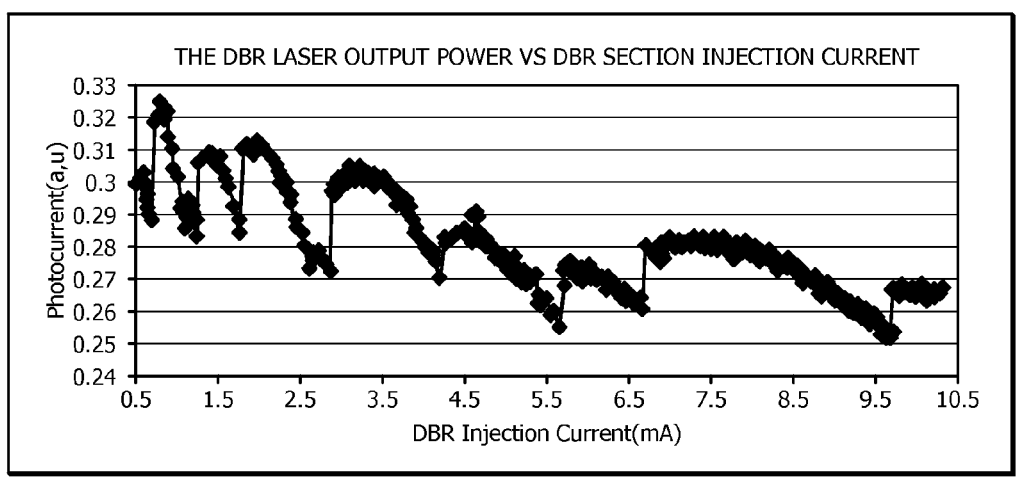
FIG. 9 is a graph that shows the laser output power as a function of the DBR section injection current for the self-characterization tunable ONU Tx shown in FIG. 2.
Figure 10:
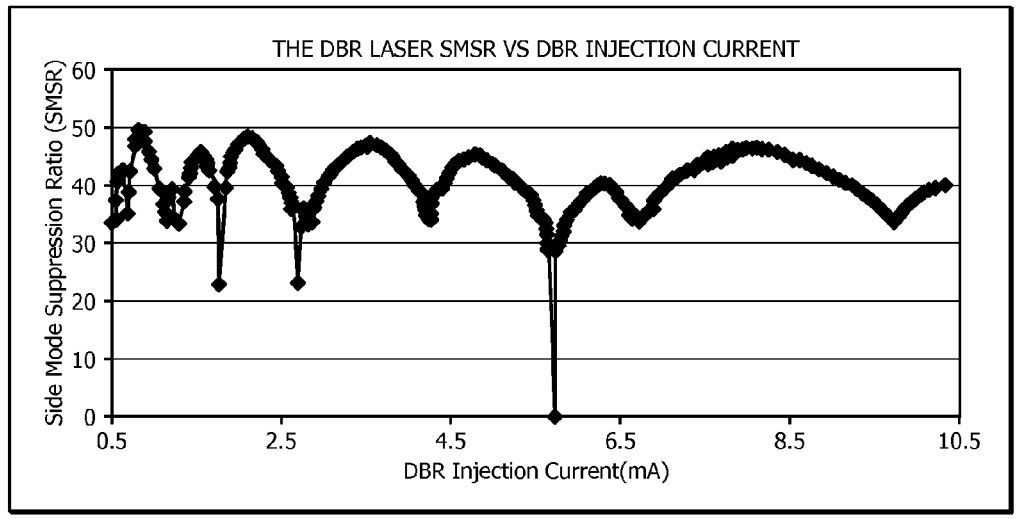
FIG. 10 is a graph that shows the DBR laser side mode suppression ratio (SMSR) as a function of the DBR section injection current for the self-characterization tunable ONU Tx shown in FIG. 2.
Figure 11:
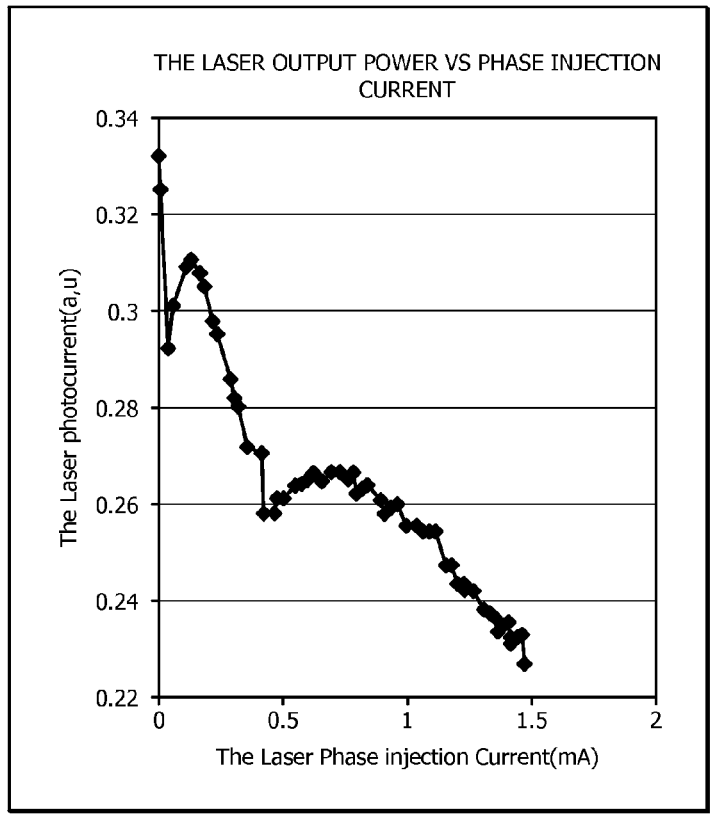
FIG. 11 is a graph that shows the laser output power as a function of the phase section injection current for the self-characterization tunable ONU Tx shown in FIG. 2.
Figures 12, 13:
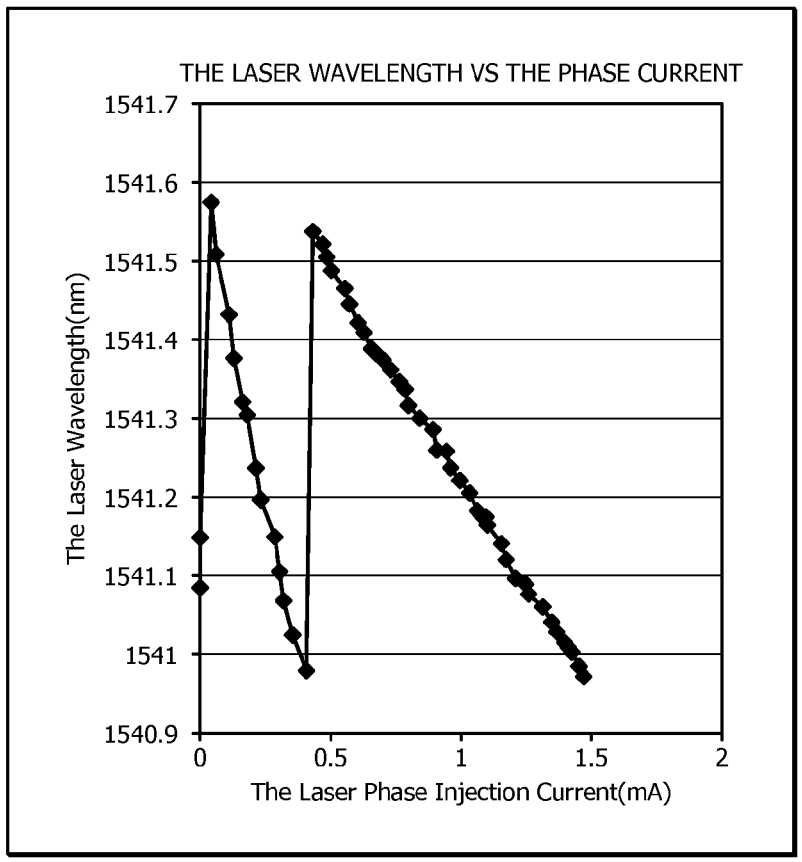
FIG. 12 is a graph that shows the laser wavelength as a function of the phase section injection current for the self-characterization tunable ONU Tx shown in FIG. 2.
FIG. 13 is a table that shows tunable transmit optical subassembly (TOSA) self-characterization results for four channels for the self-characterization tunable ONU Tx shown in FIG. 2.

FIGS. 7-13 show experimental results for various parameters of the tunable ONU Tx 200. FIG. 7 is a graph that shows the curve of DBR section 222 laser 220 output power versus DBR section 222 injection current for the self-characterization tunable ONU Tx 200 shown in FIG. 2. FIG. 8 is a graph that shows the curve of the laser 220 wavelength as a function of the DBR section 222 injection current for the self-characterization tunable ONU Tx 200 shown in FIG. 2. FIG. 9 is a graph that shows the laser 220 output power as a function of the DBR section 222 injection current for the self-characterization tunable ONU Tx 200 shown in FIG. 2. FIG. 10 is a graph that shows the DBR laser side mode suppression ratio (SMSR) as a function of the DBR section 222 injection current for the self-characterization tunable ONU Tx 200 shown in FIG. 2. FIG. 11 is a graph that shows the laser 220 output power as a function of the phase section 224 injection current for the self-characterization tunable ONU Tx 200 shown in FIG. 2. FIG. 12 is a graph that shows the laser 220 wavelength as a function of the phase section 224 injection current for the self-characterization tunable ONU Tx 200 shown in FIG. 2. FIG. 13 is a table that shows tunable TOSA self-characterization results for four channels for the self-characterization tunable ONU Tx 200 shown in FIG. 2.

The ONU Tx 200 may save the laser 220 output power and the scanning current data of the DBR section 222 and the phase section 224 into the memory and processor unit 204 of the ONU Tx 200. An analog to digital converter (ADC) (not shown) may be used for data saving and processing. The ONU Tx 200 memory and processor unit 204 may find the maximum and minimum output power current values and save these values into a memory in the memory and processor unit 204.

Figure 14:
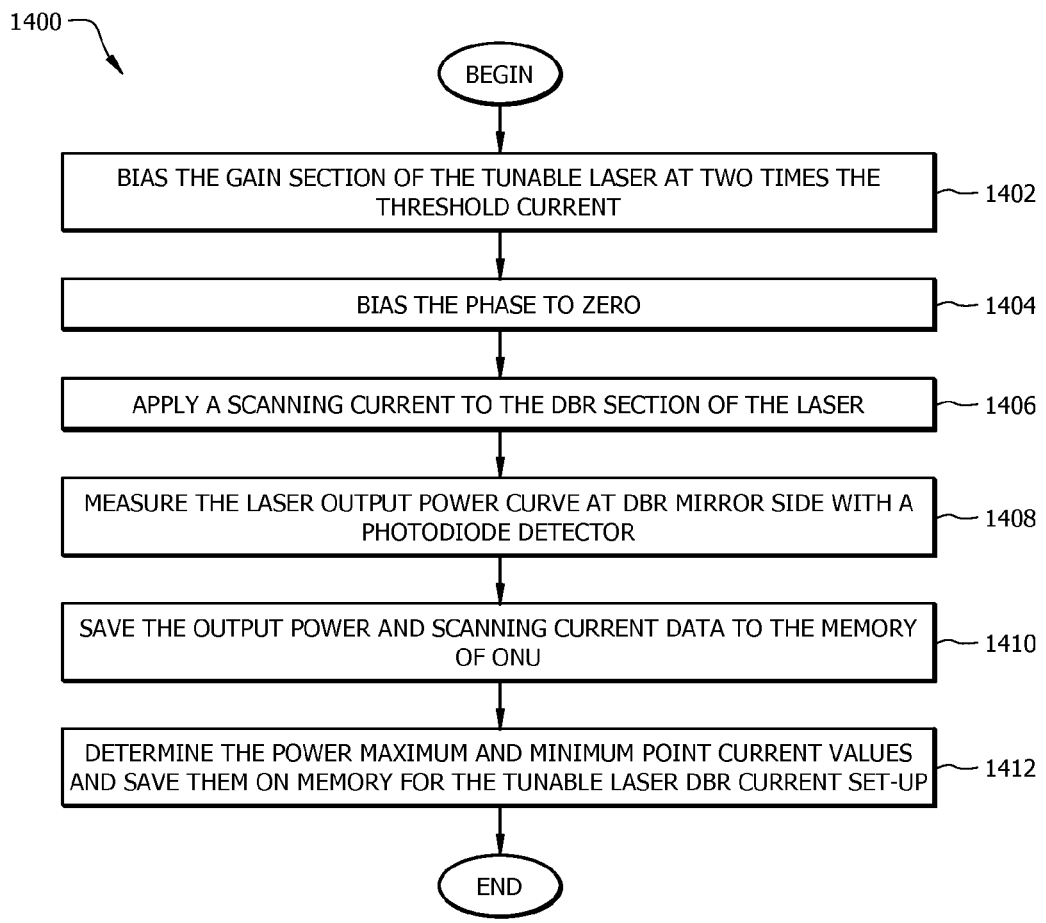
FIG. 14 is a flowchart illustrating a DBR section current scanning procedure in accordance with a disclosed embodiment.

FIG. 14 is a flowchart illustrating an exemplary DBR section 222 current scanning procedure 1400 in accordance with a disclosed embodiment. At step 1402, the gain section 226 of the tunable laser 220 is biased at two times the threshold current (or normal burst mode bias current for ONU transmitter). At step 1404, the phase section 224 is biased at zero. At step 1406, a scanning current may be applied to the DBR section 222 of the laser 220. The PD 228 at the DBR mirror side may then measure the laser 220 output power curve at step 1408. At step 1410, the output power and scanning current data may be saved to the memory 204 of the ONU Tx 200 by means of an Analog to Digital Converter (ADC). At step 1412, the memory and processing unit 204 may find the power maximum and minimum point current values and save them in memory and processing unit 204 for the tunable laser 220 DBR current set-up, after which the method 1400 may end.

Figure 15:
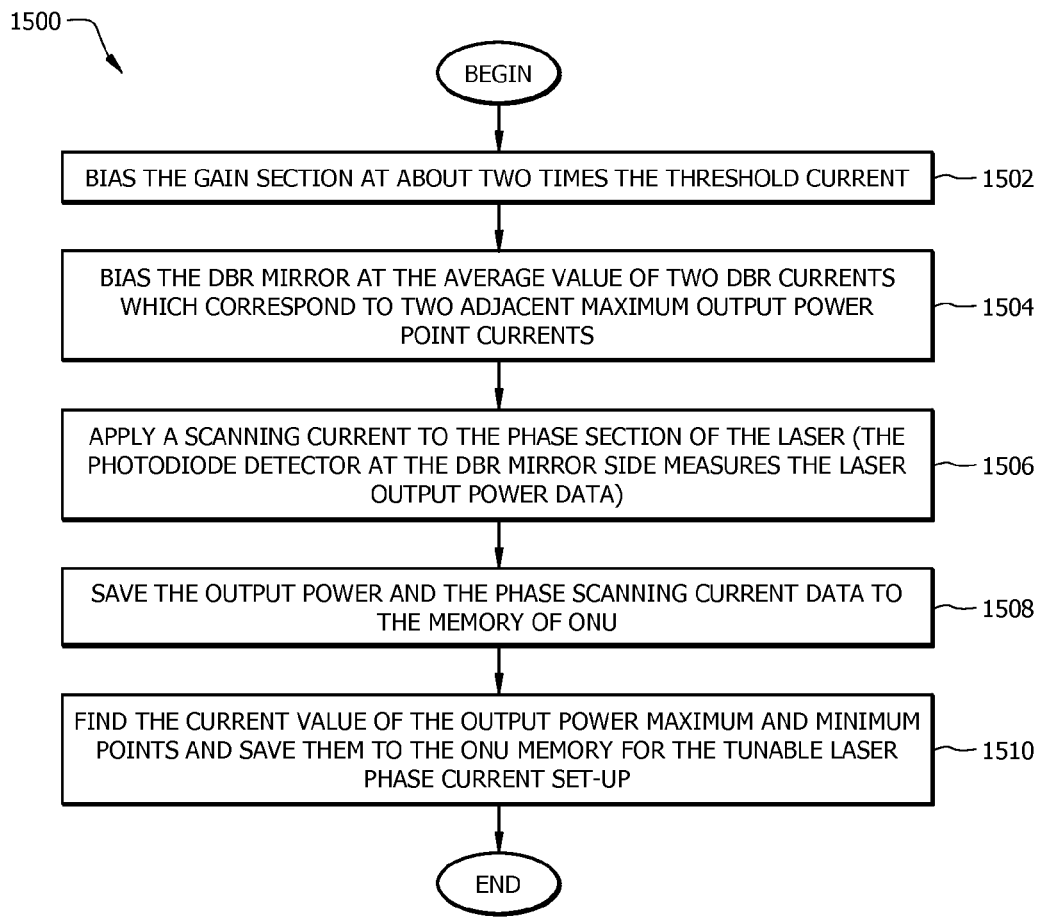
FIG. 15 is a flowchart of a phase section current scanning procedure in accordance with a disclosed embodiment.

The phase section 224 current scanning procedure is similar to that of the DBR section 222. FIG. 15 is a flowchart of an exemplary phase section 224 current scanning procedure 1500 in accordance with a disclosed embodiment. At step 1502, the gain section 226 may be biased at two times threshold current (or normal burst mode bias current for ONU transmitter). At step 1504, the DBR mirror or DBR section 222 may be biased at the average value of two DBR currents, which correspond to two adjacent maximum output power point currents 502, 504. At step 1506, a scanning current may then be applied to the phase section 224 of the laser 220, and the PD 228 at the DBR mirror side may measure the laser 220 output power data. At step 1508, the output power and phase scanning current data may then be saved to the memory of memory and processing unit 204 of the ONU Tx 200 by means of an ADC. At step 1510, the ONU's 200 memory and processing unit 204 may find the current value of output power maximum and minimum points and save the maximum and minimum points on the ONU Tx 200 memory in the memory and processing unit 204 for the tunable laser 220 phase current set-up, after which the method 1500 may end.

Figure 16:
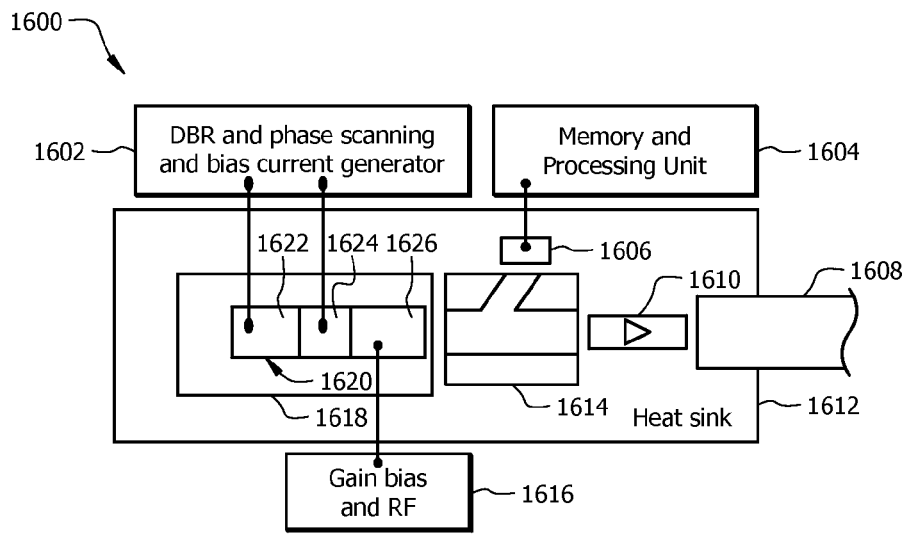
FIG. 16 is a schematic diagram of another self-characterization tunable ONU Tx in accordance with a disclosed embodiment.

In another embodiment, the tunable laser PD power monitor may also be used as the tunable laser self-characterization power detector. There are two modes: one mode is for the laser output power control detector and another mode is for the tunable laser self-characterization power detector. FIG. 16 is a schematic diagram of another self-characterization tunable ONU Tx 1600 in accordance with a disclosed embodiment. ONU Tx 1600 may comprise a DBR and phase scanning and bias current generator 1602, a gain bias and RF generator 1616, a submount 1618 comprising a tunable laser 1620, a splitter 1614, a PD power monitor 1606, a memory and processing unit 1604, an isolator 1610, an optical waveguide (or fiber) 1608, and a heat sink 1612 (with or without TEC temperature controller). Submount 1618, splitter 1614, isolator 1610, PD power monitor 1606, and optical fiber 1608 may be mounted on heat sink 1612. Tunable laser 1620 may comprise a DBR section 1622, a phase section 1624, and a gain section 1626. Otherwise, the DBR and phase scanning and bias current generator 1602, the gain bias and RF generator 1616, the submount 1618, the tunable laser 1620, the splitter 1614, the PD power monitor 1606, the memory and processing unit 1604, the isolator 1610, the optical fiber 1608, and the heat sink 1612 may be substantially the same as the corresponding components of FIG. 2. ONU Tx 1600 may differ from ONU Tx 200 in FIG. 2 in that (1) the memory and processor unit 1604 may be coupled to the PD power monitor 1606 and (2) the PD power monitor 1606 is not only used as the laser 1620 output power control, but also used as the laser 1620 self-characterization PD.

Figure 17:
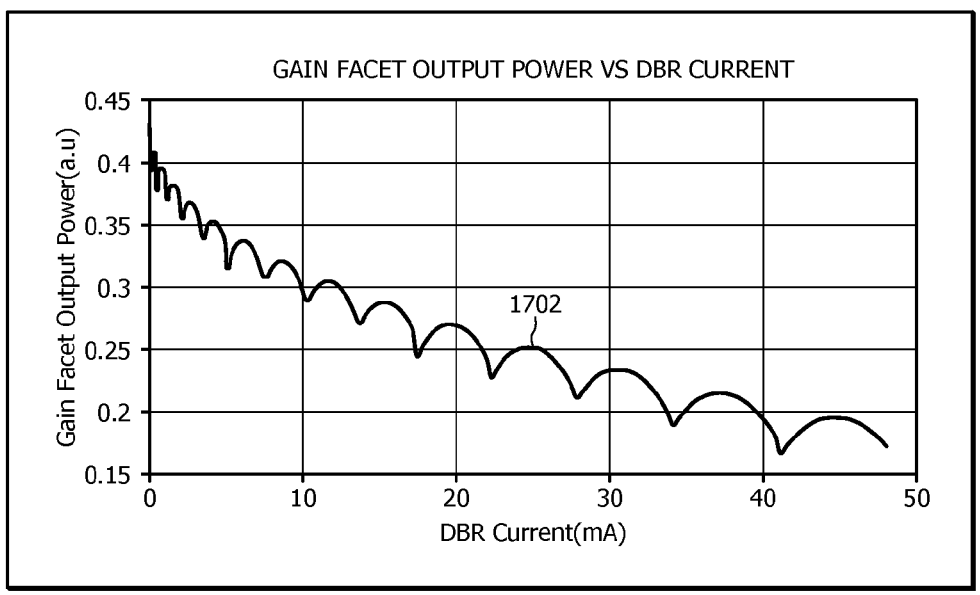
FIG. 17 is a graph of the laser output power undulation from the gain section side facet of the tunable ONU Tx in FIG. 15 with increasing DBR section mirror bias current in accordance with a disclosed embodiment.
Figure 18:
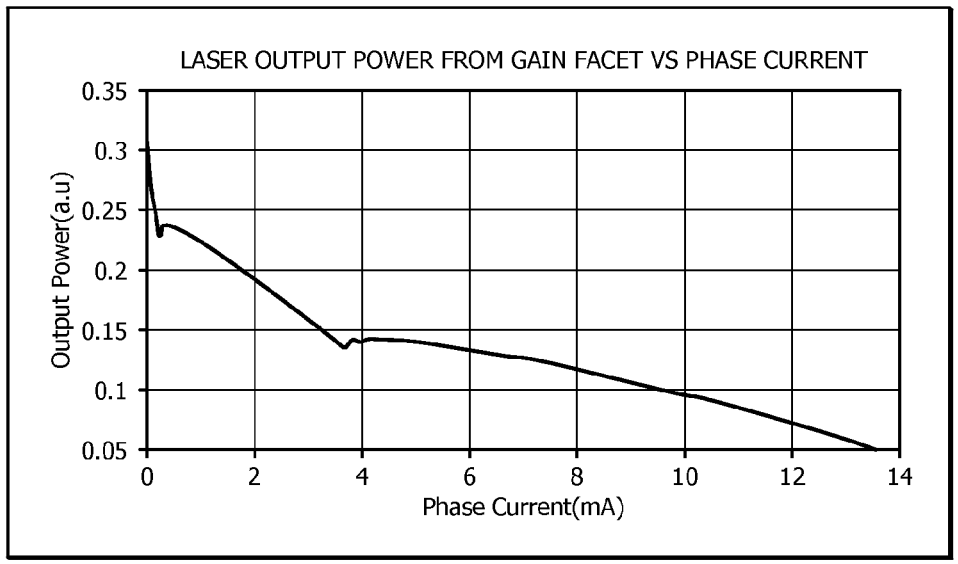
FIG. 18 is a graph of the laser output power change from the gain section side facet with different laser phase section bias current for the tunable ONU Tx in FIG. 15 in accordance with a disclosed embodiment.

The laser output power undulation from gain section 1626 facet output is different from the DBR section 1622 facet with DBR section 1622 and phase section 1624 bias current change. FIGS. 17 and 18 show the laser 1620 output power undulation from gain section 1626 side facet with increasing DBR section 1622 and phase section 1624 injection current. In FIG. 17, the laser 1620 output power undulation from gain section 1626 side facet with increasing DBR section 1622 mirror bias current. For the results shown in FIG. 17, the gain section 1626 bias of the laser 1620 was at two times threshold current, and the phase section 1624 bias was about zero mA. In FIG. 18, the laser 1620 output power change from the gain section 1626 side facet with different laser 1620 phase section 1624 bias current is shown. For the results shown in FIG. 18, the gain section 1626 bias current was above two times the laser 1620 threshold current, and the DBR section 1622 mirror bias was about 11.8 mA ($10^{th}$ mode maximum output power point DBR current).

Returning to FIG. 16, for the tunable laser 1620 which uses one PD 1606, this PD detector 1606 may have two functions: laser 1620 power monitor and the laser 1620 self-characterization detector. Under the condition of the tunable laser 1620 self-characterization mode, the PD 1606 may be similar to the laser 1620 DBR section 1622 mirror side detector. The output power and DBR section 1622 scanning current data may be saved in the memory of memory and processor unit 1604 of the ONU Tx 1600 by means of, for example, an ADC (not shown). The memory and processor unit 1604 may find the DBR section 1622 mirror bias current value, which may be related to the maximum and minimum power points. The DBR section 1622 mirror bias current value may be saved in a memory of the memory and processing unit 1604 for the use of the ONU Tx 1600 wavelength set up. The laser 1620 output power data from the gain section 1622 side facet output and the data of the phase section 1624 current may also be saved in a memory of the memory and processor unit 1604 by means of, for example, an ADC (not shown). The memory and processor unit 1604 may find the phase current values which are related to the output power maximum and minimum points and save these phase current values in a memory of the memory and processing unit 1604 for tunable ONU Tx 1600 wavelength setting. When the tunable laser 1620 phase section 1624 is tuned by changing injection current, the DBR section 1622 may be biased at some current value which may be related to the maximum output power point (e.g., point 1702) DBR section 1622 current in FIG. 17. In an embodiment, the ONU Tx 1600 may characterize itself by means of output power undulation with DBR and phase injection current change when the tunable laser gain section is biased above its threshold current. The ONU Tx 1600 may analyze the output power and scanning current data and find the laser mode hopping points for a specific DBR section 1920 and phase section 1922 scanning current and save these point current values to its memory in the memory and processing unit 1604. The ONU Tx 1600 may also find an optimal DBR section 1920 and phase section 1922 bias current by means of analyzing the scanning output power and scanning current data. These data and values may be used for ONU TX 1900 wavelength set-up.

Figure 19:
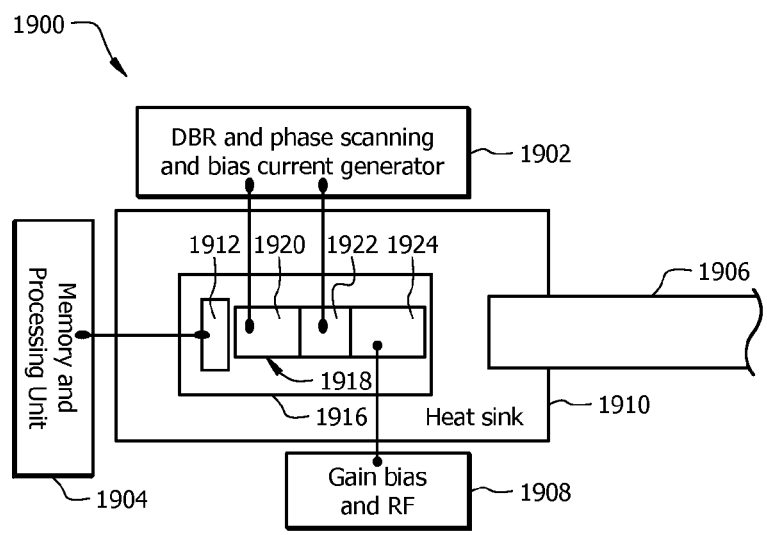
FIG. 19 is a schematic diagram of another type of self-characterization tunable ONU Tx in accordance with a disclosed embodiment.

FIG. 19 is a schematic diagram of another type of self-characterization tunable ONU Tx 1900 in accordance with a disclosed embodiment. ONU Tx 1900 may comprise a memory and processing unit 1904, a submount 1916 comprising a PD 1912 and a tunable laser 1918, a DBR and phase scanning and bias current generator 1902, a gain bias and RF generator 1908, a heat sink 1910 (with or without TEC temperature controller), and an optical waveguide (or fiber) 1906. The memory and processing unit 1904, the submount 1916, the PD 1912, the tunable laser 1918, the DBR and phase scanning and bias current generator 1902, the gain bias and RF generator 1908, the heat sink 1910, and the optical fiber 1906 may be substantially the same as the corresponding components shown in FIG. 2. Compared with the ONU Tx 200 in FIG. 2, the splitter 226, laser 220 PD power monitor 220, and the optical isolator 208 are removed in ONU Tx 1900. In addition, the DBR section 1920 side PD monitor 1912 may have two functions: tunable ONU Tx 1900 self-characterization and the laser 1918 output power monitoring.

For this type of tunable ONU Tx 1900, the tunable TOSA characterization of ONU Tx 1900 may be the same as with ONU Tx 200 in FIG. 2, and the laser 1918 DBR and phase current set-up procedures may be the same as ONU Tx 200 as well. One difference between ONU Tx 1900 and ONU Tx 200 is that PD 1912 also monitors the laser 1918 output power. Since the DBR section 1920 and the phase section 1922 absorption coefficient is proportional to carrier density in the waveguide layer, the DBR section 1920 and the phase section 1922 loss may increase when their bias current increases. This will result in the DBR section 1920 side output power decreasing when the DBR section 1920 and phase section 1922 bias current increases even though the gain section 1924 facet output power may be unchanged. For this PD power monitor 1912, another issue may be that the DBR section 1920 and the phase section 1922 may emit light spontaneously. This may be somewhat compensated for with free-carrier absorption loss. Fortunately, the DBR section 1920 side output power of the laser 1918 change is slow with increasing injecting current and can be corrected by adding absorption loss into the DBR section 1920 output power and compensating free-carrier absorption loss.

Figure 20:
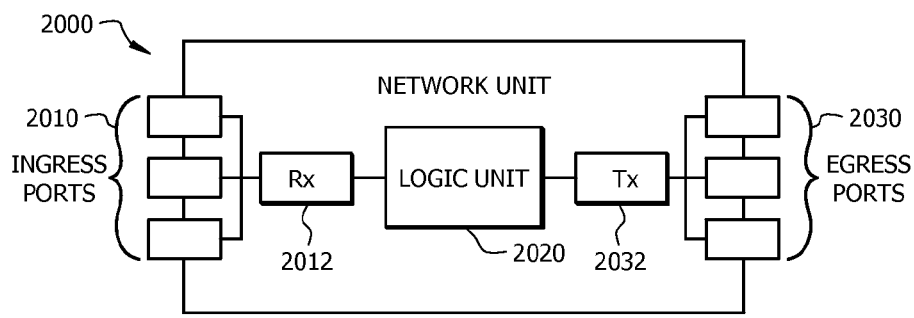
FIG. 20 is a schematic diagram illustrating an embodiment of a network unit, which may be any device that transports and processes data through the network.

FIG. 20 illustrates an embodiment of a network unit 2000, which may be any device that transports and processes data through the network. For instance, the network unit 2000 may correspond to or may be located at an ONU, such as ONUs 120 described above. The network unit 2000 may comprise one or more ingress ports or units 2010 coupled to a receiver (Rx) 2012 for receiving signals and frames/data from other network components. The network unit 2000 may comprise a processor or logic unit 2020 to determine which network components to send data to. For example, the logic unit 2020 may comprise tunable ONU Tx 200, memory and processor unit 204, and/or gain bias and RF generator 206. The logic unit 2020 may be implemented using hardware, software, or both. The network unit 2000 may also comprise one or more egress ports or units 2030 coupled to a transmitter (Tx) 2032 for transmitting signals and frames/data to the other network components. As such, the logic unit 2020 and transmitter 2032 may implement or support the Self-Characterization Tunable ONU procedures described above. The components of the network unit 2000 may be arranged as shown in FIG. 20.

The disclosed TOSA may have many advantages over the prior art. For example, current commercially available tunable transceivers are characterized manually. However, the disclosed self-characterizing tunable optical transceiver may characterize itself automatically. When the environment (e.g., temperature, etc.) of the tunable optical transceiver changes, the wavelength of the emitted radiation from the transmitter may drift, but the disclosed self-characterizing tunable optical transmitter may re-characterize itself automatically to readjust the wavelength. Additionally, in contrast to current commercially available tunable transmitters that require a wavelength locker to maintain the wavelength at a constant value and a thermoelectric cooler (TEC) to maintain a constant temperature, the disclosed tunable transmitter may not require a wavelength locker in order to maintain a constant wavelength, nor does the disclosed tunable transmitter require a TEC to maintain a constant temperature. Thus, the cost to fabricate and maintain an ONU utilizing the disclosed self-characterizing tunable optical transmitter may be lower than currently commercially available ONUs.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term about means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A transmitter comprising:
   a tunable laser comprising:
      a distributed Bragg reflector (DBR) section comprising a facet,
      a phase section coupled to the DBR section, and
      a gain section coupled to the phase section and configured to emit light from the tunable laser;
   a photodiode (PD) coupled to the facet; and
   a processor coupled to the PD and configured to:
      instruct application of a first range of currents to the DBR section, a second current to the phase section, and a third current to the gain section,
      determine, via the PD, a first output power curve of the DBR section based on the first range of currents,
      determine from the first output power curve a first power maximum and a second power maximum that is adjacent to the first power maximum,
      determine a first DBR section current associated with the first power maximum and a second DBR section current associated with the second power maximum,
      determine a third DBR section current based on an average of the first DBR section current and the second DBR section current, and
      instruct application of the third DBR section current to the DBR section.

2. The transmitter of claim 1, wherein the processor is further configured to:
   instruct application of the third DBR section current to the DBR section, a second range of currents to the phase section, and the third current to the gain section;
   determine, via the PD, a second output power curve of the phase section based on the second range of currents;
   determine, from the second output power curve, a third power maximum and a fourth power maximum that is adjacent to the third power maximum;

determine a first phase section current associated with the third power maximum and a second phase section current associated with the fourth power maximum;

determine a third phase section current based on an average of the first phase section current and the second phase section current; and instruct application of the third phase section current to the phase section.

3. The transmitter of claim 1, wherein the second current is zero and the third current is twice a threshold current of the gain section.

4. The transmitter of claim 1, further comprising:
a DBR section current generator coupled to the DBR section;
a phase section current generator coupled to the phase section;
a gain section current generator coupled to the gain section;
a splitter coupled to the gain section and comprising a first output and a second output;
a PD power monitor coupled to the first output;
an isolator coupled to the second output; and
an optical fiber coupled to the isolator.

5. The transmitter of claim 4, wherein the DBR section current generator and the phase section current generator are the same.

6. The transmitter of claim 4, wherein the PD power monitor is configured to implement output power control of the tunable laser.

7. The transmitter of claim 1, further comprising:
a DBR section current generator coupled to the DBR section;
a phase section current generator coupled to the phase section;
a gain section current generator coupled to the gain section;
an isolator coupled to the gain section;
a splitter coupled to the isolator and comprising a first output and a second output;
a PD power monitor coupled to the first output; and
an optical fiber coupled to the second output.

8. The transmitter of claim 1, wherein the PD and the processor are configured to implement output power control of the tunable laser.

9. The transmitter of claim 1, wherein the processor is further configured to:
determine, via the PD, additional output power curves of the DBR section based on additional ranges of currents;
determine, from the additional output power curves, additional power maxima;
determine additional DBR section currents associated with the additional power maxima; and
determine additional averages of the additional power maxima.

* * * * *

UNITED STATES PATENT AND TRADEMARK OFFICE
CERTIFICATE OF CORRECTION

PATENT NO. : 9,106,050 B2  
APPLICATION NO. : 13/650388  
DATED : August 11, 2015  
INVENTOR(S) : Xuejin Yan Page 1 of 1

It is certified that error appears in the above-identified patent and that said Letters Patent is hereby corrected as shown below:

On the Title Page, Page 2, References Cited, Other Publications:

Delete ""Series G: Transmission Systems and Media, Digital Systems and Networks, Digital Sections and Line System- Optical Line Systems for Local and Access Networks- ONT Management and Control Interface Specification for B-PON-Erratum 1," ITU-T G.984.1, January 2007, 64 pages." and insert -- "Series G: Transmission Systems and Media, Digital Systems and Networks, Digital Sections and Line System- Optical Line Systems for Local and Access Networks- ONT Management and Control Interface Specification for B-PON- Amendment 2," ITU-T G.983.2, January 2007, 64 pages. --

Signed and Sealed this  
Fifteenth Day of March, 2016

Michelle K. Lee  
*Director of the United States Patent and Trademark Office*